(12) United States Patent
Hitzler et al.

(10) Patent No.: US 11,876,277 B2
(45) Date of Patent: Jan. 16, 2024

(54) HIGH-FREQUENCY COMPONENT

(71) Applicant: Endress+Hauser SE+Co. KG, Maulburg (DE)

(72) Inventors: Martin Hitzler, Dillingen (DE); Winfried Mayer, Buch (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 597 days.

(21) Appl. No.: 17/265,379

(22) PCT Filed: Jul. 31, 2019

(86) PCT No.: PCT/EP2019/070661
§ 371 (c)(1),
(2) Date: Feb. 2, 2021

(87) PCT Pub. No.: WO2020/025690
PCT Pub. Date: Feb. 6, 2020

(65) Prior Publication Data
US 2021/0305672 A1 Sep. 30, 2021

(30) Foreign Application Priority Data
Aug. 2, 2018 (DE) ...................... 10 2018 118 765.3

(51) Int. Cl.
*H01P 3/12* (2006.01)
*G01F 23/284* (2006.01)
(Continued)

(52) U.S. Cl.
CPC .............. *H01P 3/12* (2013.01); *G01F 23/284* (2013.01); *H01L 23/481* (2013.01);
(Continued)

(58) Field of Classification Search
CPC . H01P 3/12; H01P 5/08; G01F 23/284; H01L 23/481; H01L 23/5286;
(Continued)

(56) References Cited

U.S. PATENT DOCUMENTS 9,583,811 B2    2/2017 Seler et al.
9,978,676 B2 *  5/2018 Gu ........................ H01L 24/63
(Continued)

FOREIGN PATENT DOCUMENTS

CN    102255126 A    11/2011
CN    104737364 A    6/2015
(Continued)

*Primary Examiner* — Adam D Houston
(74) *Attorney, Agent, or Firm* — Christopher R. Powers; Endress+Hauser (USA) Holding, Inc.

(57) ABSTRACT

A high-frequency component for radar-based distance measurement comprises: a semiconductor component configured to generate electrical high-frequency signals; and coupling element configured as a substrate-integrated waveguide and electrically contacted by the semiconductor component as to couple the high-frequency signals as radar signals into a hollow waveguide of the high-frequency component, the hollow waveguide being in galvanic contact with the coupling element such that no defined distance between the hollow waveguide and the coupling element must be set to achieve an efficient coupling out of the high-frequency signal into the hollow waveguide. The galvanic contact thereby enables a simple manufacture of the high-frequency component and a compact and accurate distance measuring device using the high-frequency component.

17 Claims, 4 Drawing Sheets

(51) Int. Cl.
*H01L 23/48* (2006.01)
*H01L 23/528* (2006.01)
*H01P 5/08* (2006.01)
*H05K 1/02* (2006.01)
*H05K 1/18* (2006.01)
*H01L 23/28* (2006.01)
*H01L 23/00* (2006.01)

(52) U.S. Cl.
CPC ............ *H01L 23/5286* (2013.01); *H01P 5/08* (2013.01); *H05K 1/0237* (2013.01); *H05K 1/181* (2013.01); *H01L 23/28* (2013.01); *H01L 24/16* (2013.01); *H01L 2224/16225* (2013.01)

(58) Field of Classification Search
CPC ............. H01L 23/28; H01L 24/16; H01L 2224/16225; H05K 1/0237; H05K 1/181
See application file for complete search history.

(56) References Cited

U.S. PATENT DOCUMENTS

| | | | | |
|---|---|---|---|---|
| 10,685,924 | B2 * | 6/2020 | Lasiter | H01L 21/6835 |
| 11,362,436 | B2 * | 6/2022 | Brandenburg | H01Q 21/005 |
| 11,394,094 | B2 * | 7/2022 | Kamgaing | H01P 1/022 |
| 11,532,867 | B2 * | 12/2022 | Chuang | H01L 24/16 |
| 11,810,875 | B2 * | 11/2023 | Syed | H01L 23/49816 |
| 2006/0274992 | A1 | 12/2006 | Shimura et al. | |
| 2009/0289835 | A1 * | 11/2009 | Edvardsson | G01F 23/284 342/124 |
| 2011/0234466 | A1 | 9/2011 | Yamada | |
| 2012/0188030 | A1 | 7/2012 | Liu et al. | |
| 2012/0242427 | A1 | 9/2012 | Suzuki | |
| 2013/0295720 | A1 * | 11/2013 | Fuergut | H01L 24/96 438/107 |
| 2014/0111394 | A1 | 4/2014 | Seok et al. | |
| 2016/0043455 | A1 | 2/2016 | Seler et al. | |
| 2016/0118705 | A1 | 4/2016 | Tang et al. | |
| 2017/0324135 | A1 | 11/2017 | Blech et al. | |
| 2019/0386709 | A1 * | 12/2019 | Woerlee | H04B 5/0031 |
| 2020/0251430 | A1 * | 8/2020 | Seler | G01S 13/08 |
| 2021/0225719 | A1 * | 7/2021 | Seler | H01L 24/20 |
| 2021/0305672 | A1 * | 9/2021 | Hitzler | H01P 3/12 |
| 2021/0359387 | A1 * | 11/2021 | Hartner | H01Q 1/2283 |
| 2022/0059918 | A1 * | 2/2022 | Hartner | H05K 1/0243 |
| 2022/0102835 | A1 * | 3/2022 | Makurin | H01Q 1/52 |
| 2022/0189894 | A1 * | 6/2022 | Zanati | H01L 23/552 |
| 2022/0247089 | A1 * | 8/2022 | Hartner | H01P 5/107 |
| 2022/0328432 | A1 * | 10/2022 | Syed | H01L 23/49838 |
| 2023/0198114 | A1 * | 6/2023 | Tiemeijer | H01Q 13/206 333/204 |
| 2023/0291115 | A1 * | 9/2023 | Hollaender | H01Q 13/106 343/702 |

FOREIGN PATENT DOCUMENTS

| | | | |
|---|---|---|---|
| DE | 102011018650 A1 * | 10/2011 | |
| DE | 102015112861 A1 | 2/2016 | |
| DE | 102015119690 A1 | 5/2017 | |
| JP | 2002208807 A | 7/2002 | |
| JP | 2020125927 A * | 8/2020 | |
| WO | WO-03028420 A1 * | 4/2003 | |
| WO | WO-2011080262 A1 * | 7/2011 | |
| WO | 2014107108 A1 | 7/2014 | |

* cited by examiner

HIGH-FREQUENCY COMPONENT

CROSS-REFERENCE TO RELATED APPLICATIONS

The present application is related to and claims the priority benefit of German Patent Application No. 10 2018 118 765.3, filed on Aug. 2, 2018, and International Patent Application No. PCT/EP2019/070661, filed on Jul. 31, 2019, the entire contents of which are incorporated herein by reference.

TECHNICAL FIELD

The invention relates to a high-frequency component for generating or processing radar signals, which is suitable for use in radar-based fill-level measuring devices.

BACKGROUND

Radar-based distance measurement is used in a broad range of applications. Corresponding distance measuring devices are used, for example, for position determination in aviation, for distance measurement in motor vehicles or for fill-level measurement in the process automation of industrial plants. In addition to the pulse transit time method, the FMCW method (frequency-modulated continuous wave, also known as continuous-wave radar) is predominantly implemented as a measuring method. Both methods are operated at defined radar frequencies or within defined frequency bands. In the context of this invention, the terms "radar" and "high frequency" refer to electrical signals or electromagnetic waves with frequencies between 0.03 GHz and 300 GHz. The operating principle of fill-level measuring devices based on FMCW and pulse radar is described, for example, in *Radar Level Measurement*, Peter Devine, 2000.

In the field of fill-level measurement, radar frequencies of 6 GHz, 26 GHz or 79 GHz are predominantly used. Here, at least in the case of FMCW, higher frequency bands are preferred in that a greater absolute frequency bandwidth can be used. At 79 GHz, for example, a bandwidth of 2 GHz is used, that is to say from 78 GHz to 80 GHz. With a greater bandwidth, a higher resolution of distance measurement can in turn be achieved. Especially in the case of fill-level measurement, this represents an important requirement since, depending on the application, as accurate a knowledge as possible of the fill level is required. A further advantage of using high frequencies is that the radar-based distance measuring device can be equipped with a more compact antenna without reducing the bundling effect of the antenna. In fill-level measurement, for example, this makes it possible to have reduced connection flanges for attachment to the container. It is therefore desirable to also operate fill-level or distance measurement generally at frequencies higher than 79 GHz (up to radar frequencies of 300 GHz).

Radar signals at frequencies above 100 GHz can no longer be routed by means of hybrid connection technologies between the semiconductor component with which the corresponding electrical high-frequency signal is generated and the circuit board on which the semiconductor component is mounted. Since the dimensions of the connection structures, such as bond wires or soldering points, to the respective electronic components are within the order of magnitude of the wavelength of the radar signals, these connection structures disturb the transmission behavior as parasitic elements. In addition, many of the materials customary in electronics cause losses that increase with frequency, due to which the electrical high-frequency signals are significantly attenuated even over short line distances. This is why a high-performance and reliable contacting of the semiconductor component by means of standard hybrid technologies is difficult with increasing frequency.

For this reason, for the generation or reception of radar signals, e.g., above 60 GHz, semiconductor components are used from which the electrical high-frequency signal can be emitted directly as a radar signal, or with which incoming radar signals can be converted directly into corresponding electrical high-frequency signals. Hybrid signal routing is thus no longer required. In this case, the radar signals are emitted and/or coupled-in by means of a corresponding primary emitter. This is, for example, a planar antenna, which is attached to the semiconductor component by means of micromechanical methods. Such a semiconductor component is inter alia described in publication DE 10 2015 119 690 A1. This thus prevents the electrical high-frequency signals from having to be routed through external conductor tracks, soldered connections or bond wires. This reduces the performance and susceptibility to interference of the distance measuring device precisely at high frequencies.

Another advantage of a monolithic implementation is that both signal generation and signal evaluation can be implemented in the same semiconductor component. For this purpose, known circuit components can be implemented depending on the measurement method. In the case of FMCW, the high-frequency signal for the radar signal that is to be emitted can be generated by means of a PLL (phase-locked loop); the received radar signal can be mixed by a mixer with the high-frequency signal that is to be emitted so that the distance or fill level can be determined from the so-called difference frequency of the mixed signal. A correspondingly designed evaluation block can, for example, determine the difference frequency by means of an FFT (Fast Fourier Transform) of the mixed signal.

In order that the semiconductor component can emit and couple-in radar signals efficiently, the housing of the semiconductor component must be correspondingly encapsulated for this purpose. Complete encapsulation of the semiconductor component by means of injection molding, as is the case, for example, with SMD components (surface-mounted device), is not possible since the radar signals can be attenuated or completely absorbed thereby. Patent specification U.S. Pat. No. 9,583,811 B2 describes, for example, a semiconductor component that is suitably encapsulated in order to couple high-frequency signals as radar signals into a hollow waveguide. For this purpose, a coupling element is arranged on the semiconductor component, wherein the encapsulation there comprises an integrated hollow waveguide which is arranged galvanically separated at a defined distance above the coupling element. In order to position the hollow waveguide correctly with respect to the semiconductor component, however, a correspondingly complex adjustment in the attachment of the encapsulation may be necessary.

SUMMARY

The invention is therefore based on the object of providing a high-frequency component that is simple to manufacture and by means of which radar signals can be efficiently decoupled and coupled.

The invention solves this problem by means of a high-frequency component which comprises the following components: a semiconductor component designed to generate and/or process electrical high-frequency signals; and a coupling element taking the form of an SIW (substrate-integrated waveguide) which is in galvanic contact with the semiconductor component in order to couple the high-frequency signals as radar signals into a hollow waveguide, and/or to couple radar signals from the hollow waveguide as electrical signals into the semiconductor component.

According to the invention, the high-frequency component includes a galvanic contact between the coupling element and the hollow waveguide. In the context of the invention, galvanic contact is defined as electrical contacting between the electrically conductive interior of the hollow waveguide and the corresponding electrical conductor structure of the electrical high-frequency signal on the coupling element.

The advantage here is that no defined distance or no defined position of the hollow waveguide with respect to the coupling element has to be adjusted in order to achieve efficient decoupling and coupling of the high-frequency signal into the hollow waveguide since this is already achieved by a corresponding design of the coupling element. Assembly of the high-frequency component is thus simplified.

Despite the galvanic contact between the hollow waveguide and the coupling element, mechanical stress on the sensitive semiconductor component due to the hollow waveguide can be suppressed. For this purpose, it is advantageous if the coupling element has a thickness of at least 200 µm.

Known assembly and connection technologies can be used for the electrical and/or mechanical contacting of the coupling element. For example, the semiconductor component and the coupling element for coupling the high-frequency signals can be contacted by means of a soldered connection, for example in the form of a ball grid array. An encapsulation of the semiconductor component can also be effected using known technologies, such as potting encapsulation, for example. However, the semiconductor component must be encapsulated in such a way that the galvanic contact surface of the coupling element is free of potting compound up to the hollow waveguide. By means of further developed connection technologies, it can optionally be achieved that the coupling element is designed as an integral component of the potting encapsulation. This can be achieved, for example, by means of TPV technology (through-package via) as described, for example, in the international publication WO 2014107108 A1.

Within the scope of the invention, the coupling element can in principle be constructed on the materials and production methods for printed circuit boards. Accordingly, the coupling element can be manufactured from a substrate, e.g., a glass- or ceramic-based substrate. For a coupling in terms of signaling between the semiconductor component and the hollow waveguide, the coupling element can, for example, be based on:
  a first metallization layer for the galvanic contacting of the hollow waveguide;
  a second metallization layer;
  first electrical vias for contacting the semiconductor component with the first metallization layer; and
  second electrical vias between the two metallization layers.

Here, the diameter of the vias can in principle be adjusted as desired, depending on the manufacturing method. In the common laser-drilling and metallization methods, the diameter is less than 250 µm. By means of special methods, such as the so-called glass process in which the coupling element is based on glass, small diameters between 40 µm and 80 µm can also be achieved.

In order to efficiently transmit the high-frequency signals in the coupling element, it is advantageous as regards the vias if the first vias are arranged along an inner, quasi-closed contour in such a way that the high-frequency signals in the coupling element are guided predominantly in a defined fundamental mode, e.g., the $TE_{10}$ mode. Additionally or alternatively, the transmission of the high-frequency signals in the coupling element can be further improved if, in relation to the first inner contour, the second vias are arranged along an outer, quasi-closed contour in such a way that the high-frequency signals are directed in the direction of the axis of the hollow waveguide or are directed from this direction into the plane of the metallization layers.

For a simple manufacture of the high-frequency component, it is advantageous if a printed circuit board serves as a substrate for arranging the further components (semiconductor component, coupling element and hollow waveguide) of the high-frequency component. However, the arrangement of these components amongst each other is not firmly prescribed. The high-frequency component according to the invention can thus be constructed, for example, by arranging the semiconductor component (either directly as bare die or indirectly by means of the lead frame of the encapsulated semiconductor component) on a surface of the printed circuit board substrate, wherein the hollow waveguide is fastened to the same surface of the printed circuit board substrate. Here, the coupling element is arranged on the surface of the semiconductor component that faces away from the printed circuit board substrate. In this case, the hollow waveguide can function as an optional additional encapsulation of the semiconductor component and of the coupling element above it if, for example, the hollow waveguide is enclosed in a corresponding cover. Such a cover can, for example, in turn be manufactured by injection molding methods.

An alternative possibility of arranging the components (semiconductor component, coupling element and hollow waveguide) with respect to each other is for the coupling element to be arranged on a first surface of the printed circuit board substrate. If, in this case, the semiconductor component is arranged on a surface of the coupling element that faces away from the printed circuit board substrate, the hollow waveguide can be fastened to a second surface of the printed circuit board substrate that faces away from the coupling element. In this case, however, the hollow waveguide is to be put into galvanic contact with the coupling element through an opening in the printed circuit board. This arrangement possibility offers the advantage of being able to implement the high-frequency component very flatly.

A third possibility of arranging the components is for the coupling element and the hollow waveguide to be arranged on the first surface of the printed circuit board substrate, while the semiconductor component is arranged on a surface of the coupling element that faces away from the printed circuit board substrate. This embodiment offers the special advantage that the semiconductor component does not experience any pressure during the galvanic contacting of the hollow waveguide at the coupling element and is therefore very uncritical to manufacture.

Depending on the arrangement of the components, it may be advantageous for the purpose of suitable manufacturability to first carry out the electrical or mechanical contacting of the coupling element at the semiconductor component before the galvanic contacting of the hollow waveguide takes place at the coupling element. Irrespective of whether the semiconductor component is arranged on a printed circuit board substrate, this manufacturing variant is first and foremost suitable if the coupling element is arranged above the semiconductor component and the hollow waveguide is arranged above the coupling element. The idea according to the invention has an advantageous effect overall on the manufacturability of the high-frequency component, provided the semiconductor component is designed to generate the high-frequency signals with high frequencies of 75 GHz or higher, since the individual structures can be dimensioned to be sufficiently large despite the high frequencies.

A radar-based distance measuring device for determining a distance to a measurement object can be constructed on the basis of the high-frequency component according to the invention according to one of the embodiments described above. In addition to the high-frequency component, it must include the following further component: an antenna which is connected to the hollow waveguide and is designed to emit the radar signals in the direction of the measurement object and to receive said signals after reflection at the measurement object.

For this purpose, the semiconductor component must be designed such that it can determine the distance on the basis of at least the reflected radar signals. The design specifically depends on the implemented measuring principle, that is to say, for example, FMCW or the pulse transit time principle. In the case of FMCW, the semiconductor component for generating the high-frequency signal may comprise a PLL. By means of a mixer, the coupled high-frequency signal can be mixed in the semiconductor component with the high-frequency signal that is to be emitted so that the semiconductor component can determine the distance from the difference frequency of the mixed signal. A correspondingly designed evaluation block of the semiconductor component can determine the difference frequency, for example, by means of an FFT of the mixed signal. When using the pulse transit time method, the circuit assemblies or functions known from the prior art can be implemented in the semiconductor component analogously to FMCW. Due to the potentially high frequencies of the distance measuring device based on the high-frequency component according to the invention, a high resolution of the distance measurement results. It is therefore especially appropriate to use such a distance measuring device as a fill-level measuring device that serves for measuring the fill level of a filling material located in a container.

BRIEF DESCRIPTION OF THE DRAWINGS

The invention is explained in more detail with reference to the following figures. The following is shown.

DETAILED DESCRIPTION

Figure 1:
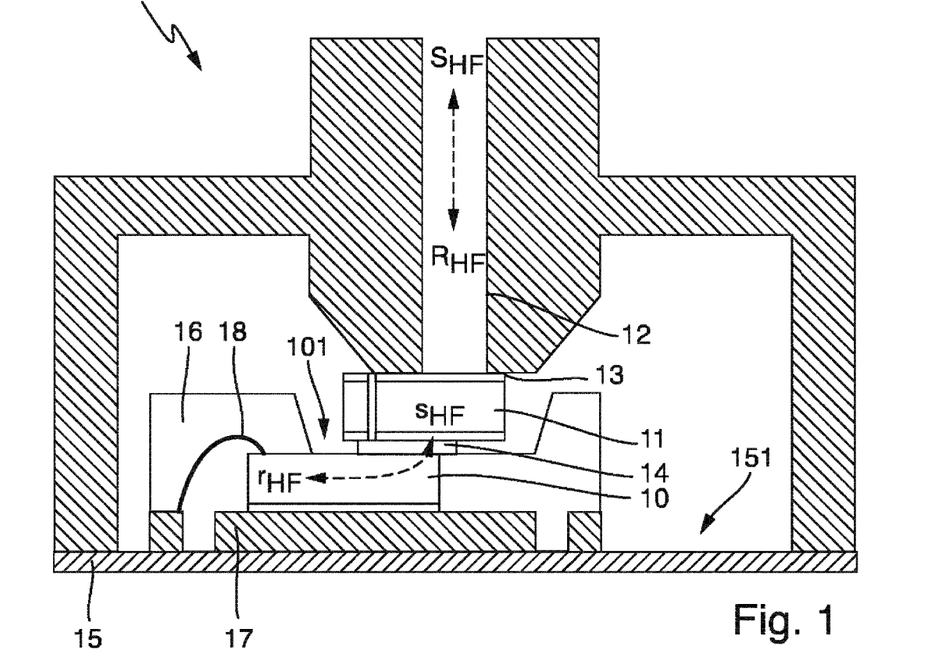
FIG. 1 shows a first embodiment of the high-frequency component according to the present disclosure.

FIG. 1 shows a possible realization variant of a high-frequency component 1 according to the invention. As essential components, it comprises a semiconductor component 10 for generating and processing electrical high-frequency signals $s_{HF}$, $r_{HF}$. The high-frequency component 1 additionally comprises a coupling element 11 that is electrically contacted with the semiconductor component 10 so that the high-frequency signals $s_{HF}$ can be coupled as radar signals $S_{HF}$ into a hollow waveguide 12 and the radar signals $R_{HF}$ from the hollow waveguide 12 can thus be coupled as electrical signals $r_{HF}$ into the semiconductor component 10. Here, a galvanic contact 13 is formed between the coupling element 11 and the hollow waveguide 12.

In the embodiment shown in FIG. 1 of the high-frequency component 1 according to the invention, the semiconductor component 10 is arranged on a lead frame 17 and encapsulated by a potting encapsulation 16, wherein the contact surface toward the coupling element 11 is left open by the potting compound 16. The semiconductor component 10 can thus be designed, for example, as a correspondingly modified DIP (dual in-line package) or QFN (quad flat no-leads package) component. As an alternative to the embodiment shown in FIG. 1, it is likewise conceivable to encapsulate the semiconductor component 10 together with the coupling element 11 by means of potting encapsulation 16 so that only the galvanic contact surface 13 of the coupling element 11 toward the hollow waveguide 12 remains uncovered by the potting encapsulation.

In the realization variant shown in FIG. 1, corresponding bond connections 18 function as electrical contacting of the semiconductor component 10 with the lead frame 17. In the embodiment shown in FIG. 1, a printed circuit board 15 serves as the substrate of the encapsulated semiconductor component 10 (for the purposes of the invention, it would likewise be conceivable to mount the semiconductor component directly on the printed circuit board substrate 15 as a bare die, e.g., without prior encapsulation), wherein the lead frame 17 of the semiconductor component 10 and the hollow waveguide 12 are fastened to a first surface 151 of the printed circuit board substrate 15.

In FIG. 1, the coupling element 11 is arranged on the surface 101 of the semiconductor component 10 that faces away from the printed circuit board substrate 15. The coupling element 11 can in principle be constructed identically to the printed circuit board substrate 15, that is to say, based on a core made of a plastic or a ceramic or a fiber composite material. Laterally running electrical signal-, ground- or power-carrying metallization layers 110, 111 can optionally be structured and in the simplest case be made of copper (e.g., gold offers more advantageous properties for high-frequency paths). Vertical electrical vias 112 between the metallization layers 110, 111 may be designed as metallized vias (cf. also FIG. 2). In this case, the vias 112 can be manufactured, for example, by means of the glass process so that they have a diameter between approx. 40 μm and 80 μm. For efficient routing of the high-frequency signals $s_{HF}$, $r_{HF}$ in the coupling element, the vias 112 may be separated from each other by a maximum distance of one half, e.g., one tenth, of the wavelength of the radar signal $S_{HF}$, $R_{HF}$.

Correspondingly to this assembly and connection technology, the electrical or mechanical contacting 14 of the coupling element 11 to the semiconductor component 10 can also be effected by means of known methods, such as reflow soldering of a ball grid array. As an alternative to the realization variant shown in FIG. 1, it would likewise be conceivable to design the coupling element 11 directly as an integral component of the potting encapsulation 16. The TPV method (through-package via) could be used for this purpose.

Figure 2:
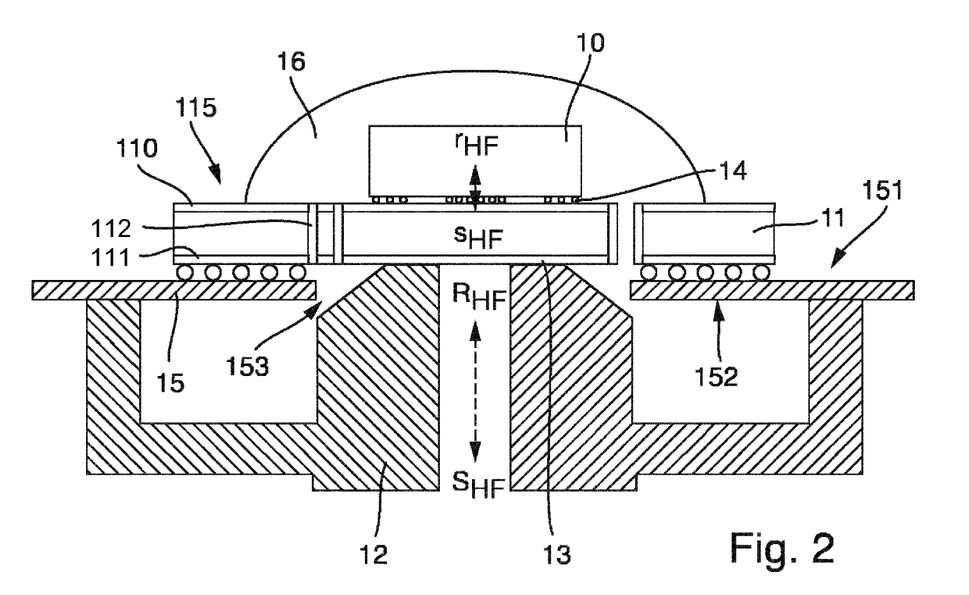
FIG. 2 shows a second embodiment of the high-frequency component according to the present disclosure.

With regard to the material from which the hollow waveguide 12 may be made, only one electrically conductive inner wall is required. If, therefore, the hollow waveguide 12 is not made entirely of a metal base body, it can have, for example, at least on the inner wall which is relevant for guiding the radar signals $S_{HF}$, $R_{HF}$, a metal coating which is applied, for example, by sputtering or PVD (physical vapor deposition). As shown in FIG. 2, the hollow waveguide 12 can function as an additional encapsulation of the semiconductor component 10 and coupling element 11, provided the hollow waveguide 12 is correspondingly designed in the form of a cover. For this purpose, the hollow waveguide 12 can be manufactured, for example, as an injection-molded part with a correspondingly metallic inner coating.

The cross-sectional shape (for example, circular or rectangular) and the dimensions of the inner cross-section of the hollow waveguide 12 are to be adapted to the frequency or the desired mode of the radar signal $S_{HF}$, $R_{HF}$ that is to be emitted/coupled. With a rectangular design, the two edge lengths of the rectangle can be designed, for example, such that they have an edge length ratio of 2:1. In this case, the first edge length can in each case be dimensioned with one third of the wavelength of the high-frequency signal $S_{HF}$, $R_{HF}$; the second edge length can accordingly be designed at two-thirds of the wavelength. The wavelength or the frequency of at least the radar signal $S_{HF}$ that is to be emitted is determined by the semiconductor component 10 since the semiconductor component 10 generates corresponding electrical high-frequency signals $S_{HF}$ on the basis of which the radar signal $S_{HF}$ is emitted in the hollow waveguide 12.

In terms of the invention, it is crucial that the electrically conductive interior of the hollow waveguide 12 forms a galvanic contact 13 to the relevant metallization layer 110 on the coupling element 11. For this purpose, it may already be sufficient for the galvanic contact 13 to be achieved solely by means of a mechanical contact pressure of the hollow waveguide 12 onto the coupling element 11. During the manufacture of the high-frequency component 1, a separate electrical contacting of the hollow waveguide 12, for example by soldering, is thus purely optional. As shown in FIG. 2, such a contact pressure can be brought about by attaching the hollow waveguide 12 to the printed circuit board substrate 15 by, for example, gluing, screwing or by a plug-in connection. In this case, a desired, permanent contact pressure is produced, provided the hollow waveguide 12 has a corresponding vertical under-dimensioning. Due to the fact that a possible contact pressure of the hollow waveguide 12 does not act directly on the semiconductor component 10 but is relieved by the coupling element 11, the sensitive semiconductor component 10 is correspondingly protected from the resulting mechanical stress. The thicker the coupling element 11 is, the better the protection will be. A thickness of the coupling element of 200 μm or more is therefore recommended.

The embodiment shown in FIG. 1 can be manufactured when the electrical or mechanical contacting of the coupling element 11 to the semiconductor component 10 is performed first before the galvanic contacting 13 of the hollow waveguide 12 to the coupling element 11 takes place. It is understood that the semiconductor component 10 (optionally together with the coupling element 11) or the lead frame 17 must first be fastened to the printed circuit board substrate 15 so that the hollow waveguide 12 can be fastened to the printed circuit board substrate 15 for the purpose of galvanic contacting 13. The galvanic contact 13 according to the invention between the hollow waveguide 12 and the coupling element 11 has an advantageous effect in that lower tolerances are required in the placement of the hollow waveguide 12 on the coupling element 11. The galvanic contact 13 can be provided here by dimensioning the corresponding first metallization layer 110 for the high-frequency signals $s_{HF}$, $r_{HF}$ on the coupling element 11 with corresponding tolerances. In comparison with the prior art, it is thus not necessary to maintain precisely defined gap dimensions between coupling element 11 and hollow waveguide 12 which are exact to the micrometer depending on the mode and the frequency of the radar signal $S_{HF}$, $R_{HF}$ in order to achieve efficient emission/coupling.

FIG. 2 shows a further embodiment of the high-frequency component 1 according to the invention: In contrast to the embodiment shown in FIG. 1, the semiconductor component 10, the coupling element 11 and the hollow waveguide 12 are not arranged together on the first surface 151 of the printed circuit board substrate 15. It is rather the case that the coupling element 11 is arranged on the first surface 151 of the printed circuit board substrate 15, while the semiconductor component 10 in this embodiment is arranged on a surface 115 of the coupling element 11 that faces away from the printed circuit board substrate 15. In this case, the semiconductor component 10 can be contacted through a corresponding ball grid array on the coupling element 11 by means of the known flip-chip assembly that is familiar in assembly and connection technology.

Unlike the coupling element 11 and the semiconductor component 10, the hollow waveguide 12 is mounted on a second surface 152 of the printed circuit board substrate 15 that faces away from the coupling element 11 or the semiconductor component 10. Accordingly, the hollow waveguide 12 is galvanically contacted with the coupling element 11 through an opening 153 in the printed circuit board. In the embodiment of the high-frequency component 1 shown in FIG. 2, it is irrelevant whether, for galvanic contacting 13 of the hollow waveguide 12 at the coupling element 11, the hollow waveguide 12 is first fastened to the printed circuit board substrate 15 or whether the coupling element 11 is attached to the printed circuit board substrate 15 before this. Moreover, it is irrelevant whether the semiconductor component 10 is contacted with the coupling element 11 before or after the coupling element 11 is attached to the printed circuit board substrate 15.

As can be seen from FIG. 2, in contrast to FIG. 1, in addition to the high-frequency signals $s_{HF}$, $r_{HF}$, other signals, such as supply voltages, low-frequency signals, etc., are also routed in the coupling element 11 of the high-frequency component 1 to the semiconductor component 10. In the embodiment shown in FIG. 2, the methods already mentioned in connection with the embodiment of the high-frequency component 1 shown in FIG. 1 can again be used as assembly and connection technologies for contacting the semiconductor component 10, the coupling element 11 and the hollow waveguide 12. In this connection, it can be seen from FIG. 2 that the potting encapsulation 16 completely encloses only the semiconductor component 10. In contrast to the representation shown, it would also be conceivable to completely enclose the coupling element 11 by means of the potting encapsulation 16. The embodiment of the high-frequency component 1 shown in FIG. 2 is advantageous in its potentially flat design.

Figure 3:
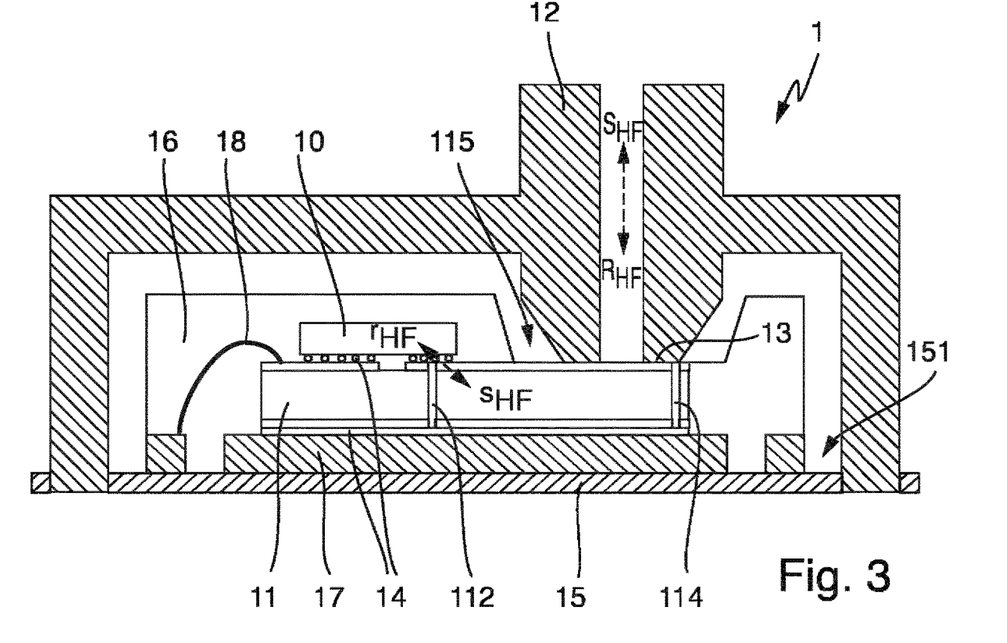
FIG. 3 shows a third embodiment of the high-frequency component according to the present disclosure.

FIG. 3 shows a third embodiment of the high-frequency component 1 according to the invention. In this embodiment, in contrast to FIG. 1, not the semiconductor component 10 but the coupling element 11 and the hollow waveguide 12 are arranged together on the first surface 151 of the printed circuit board substrate 15. As in the embodiment according to FIG. 2, the semiconductor component 10 is arranged on the surface 115 of the coupling element 11 that faces away from the printed circuit board substrate 15. Since the semiconductor component 10 is thus not arranged directly on the printed circuit board substrate 15 but rather above the coupling element 11, all other signals, such as supply voltages, low-frequency signals, etc., are also routed in the embodiment shown in FIG. 3 in the coupling element 11 to the semiconductor component 10 in addition to the high-frequency signals $S_{HF}$, $r_{HF}$. Analogously to the embodiment of the high-frequency component shown in FIG. 2, the semiconductor component 10 in FIG. 3 can also be contacted by flip-chip assembly on the coupling element 11.

In this case, the potting encapsulation 16 can be attached in such a way that the semiconductor component 10 is completely encapsulated. In this case, however, the potting encapsulation 16 is in turn to be designed such that the contact surface of the coupling element 11 for the galvanic contacting 13 of the hollow waveguide 12 is left open by the potting compound 16. In addition to the advantage that the most sensitive of all components, namely the semiconductor component 10, can be completely encapsulated, the embodiment according to FIG. 3 has the substantial advantage that no undesired voltage can be induced in the semiconductor component 10 during galvanic contacting 13 of the hollow waveguide 12 at the coupling element 11. Moreover, in comparison with the embodiment shown in FIG. 2, no opening 153 is required in the printed circuit board substrate 15.

Figure 4:
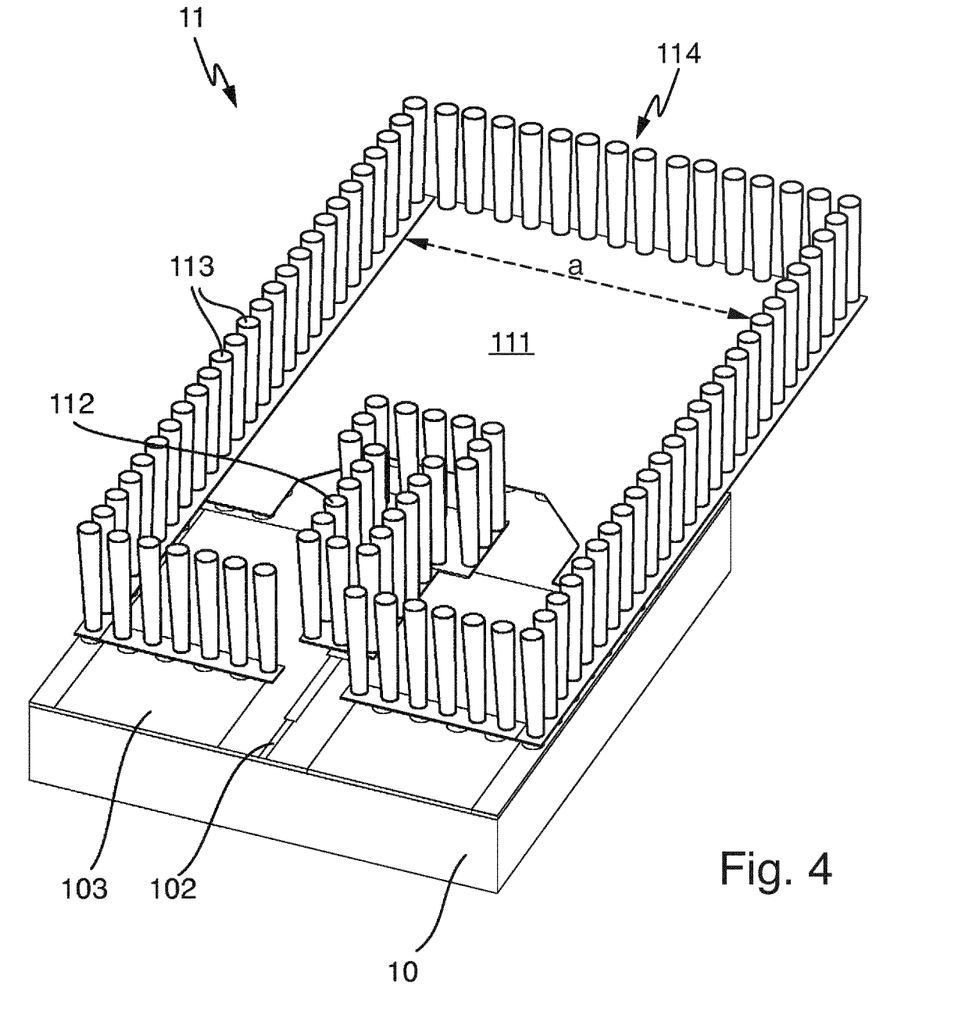
FIG. 4 shows a possible embodiment of the coupling element.

FIG. 4 shows a detailed view of the coupling element 11 for coupling the radar signals $S_{HF}$, $R_{HF}$ between the semiconductor component 10 and the hollow waveguide 12. In the embodiment shown, the coupling element 11 is based on a substrate, such as glass, plastic, ceramic or a composite material. The coupling element 11 thus functions as an SIW (substrate-integrated waveguide). For the transmission of the radar signals $S_{HF}$, $R_{HF}$ between the semiconductor component 10 and the hollow waveguide 12, the coupling element 11 comprises a first, upper metallization layer 110 and a second, lower metallization layer 111 by means of which galvanic contact 13 to the hollow waveguide 12 is established. In FIG. 4, the upper, first metallization layer 110 of the coupling element 11 is hidden for clarity.

For this reason, in FIG. 4, first vias 112 can be seen which establish the electrical contact of the upper, signal-carrying metallization layer 110 with a corresponding microstrip line 102 on the semiconductor component 10 (optionally through a corresponding ball grid array, cf. FIGS. 2 and 3). Since the electrical path of the first vias 112 crosses the plane of the lower, second metallization layer 111, the lower metallization layer 111 is structured accordingly so that the lower metallization layer 111 is electrically insulated from the first vias 112. Also visible in FIG. 4 are second vias 113 which establish the electrical connection of the first, upper metallization layer 110 to the lower, second metallization layer 111.

As can be seen in FIG. 4, in relation to the second vias 113, the first vias 112 are arranged along an inner, quasi-closed contour in the form of a "T." This causes the high-frequency signals $S_{HF}$, $r_{HF}$ in the coupling element 11 to be converted predominantly into a defined fundamental mode. For example, the shape or the size of the inner contour of first vias 112 can be optimized such that it is predominantly the $TE_{10}$ mode that is capable of propagation. The optimization can be carried out, for example, on the basis of numerical simulation.

In relation to the first vias 112, the second vias 113 are arranged along a second, external contour in the form of a rectangle. Here, the outer vias 113 have two functions. On the one hand, the radar signals $S_{HF}$ to be emitted from the plane of the metallization layers 110, 111 are to be directed in the direction of the axis of the hollow waveguide 12, or the incoming radar signals $R_{HF}$ from this direction are to be directed into the plane of the metallization layers 110, 112. In the embodiment of the coupling element 11 shown in FIG. 4, this may be achieved, e.g., by a rectilinear section 114 of the outer contour of the second vias 113. Since, after the mounting of the high-frequency module 1, the rectilinear section 114 is arranged behind the hollow waveguide 12 in relation to the first contour or the first vias 112 (see also FIG. 3), the radar signals $S_{HF}$, $R_{HF}$ are thereby deflected accordingly by 90° toward hollow waveguide 12 or into the plane of the metallization layers 110, 111. Critical to this effect is that the rectilinear section 114 of the outer contour with respect to the first vias 112 is not located in front of the inner wall (or extension thereof) of the hollow waveguide 12 that faces the inner contour.

A second function of the outer vias 113 is to route the radar signals $S_{HF}$, $R_{HF}$ laterally in the coupling element 11 between the first vias 112 and the rectilinear section 114. The rectangular, second contour or the rectilinear section therefore has a defined edge length a: In this regard, the edge length a is to be designed according to the wavelength of the radar signals $S_{HF}$, $R_{HF}$ and the mode which is formed by the first vias 112. For this purpose, it is suitable to dimension the edge length a at approximately two thirds of the wavelength of the radar signals $S_{HF}$, $R_{HF}$. For the electrical contacting of the lower, grounded metallization layer 111 of the coupling element 11 with a corresponding ground layer 103 on the semiconductor component 10, a ball grid array is provided beneath the second vias 113 in the overlap region between the semiconductor component 10 and the coupling element 11, as can be seen from FIG. 4.

In order for the radar signals $S_{HF}$, $R_{HF}$ to be efficiently coupled between the semiconductor component 10 and the hollow waveguide 12, in addition to the design of the two contours, it is likewise useful for the distance between the individual vias 112, 113 to be designed as close as possible. It is therefore advantageous to dimension the distance between the individual vias 112, 113 with at most half, e.g., one tenth, of the wavelength of the radar signal $S_{HF}$, $R_{HF}$.

In order to be able to use the high-frequency component 1 according to the invention for the purpose of radar-based distance measurement, the semiconductor component 10 must be designed, depending on the measuring principle used, such as FMCW or the pulse transit time principle, to generate or process the electrical high-frequency signals $S_{HF}$, $r_{HF}$ accordingly: In implementing the FMCW principle, the high-frequency signal $S_{HF}$ that is to be emitted can be generated, for example, by means of an oscillator (e.g., taking the form of a voltage-controlled oscillator), which is controlled by PLL (phase-locked loop). For signal processing, the semiconductor component 10 can on the receiving side comprise a mixer for mixing the high-frequency signal $S_{HF}$ that is currently to be emitted with the currently received high-frequency signal $r_{HF}$. This is used in order to be able to determine the distance from the mixed signal in a corresponding circuit block of the semiconductor component 10, e.g., by means of an FFT, by means of the frequency of the mixed signal. If the semiconductor component 10 is designed accordingly and an antenna connected to the hollow waveguide 12 is provided, the high-frequency component 1 according to the invention can be used in a distance measuring device, such as a fill-level measuring device 2.

Figure 5:
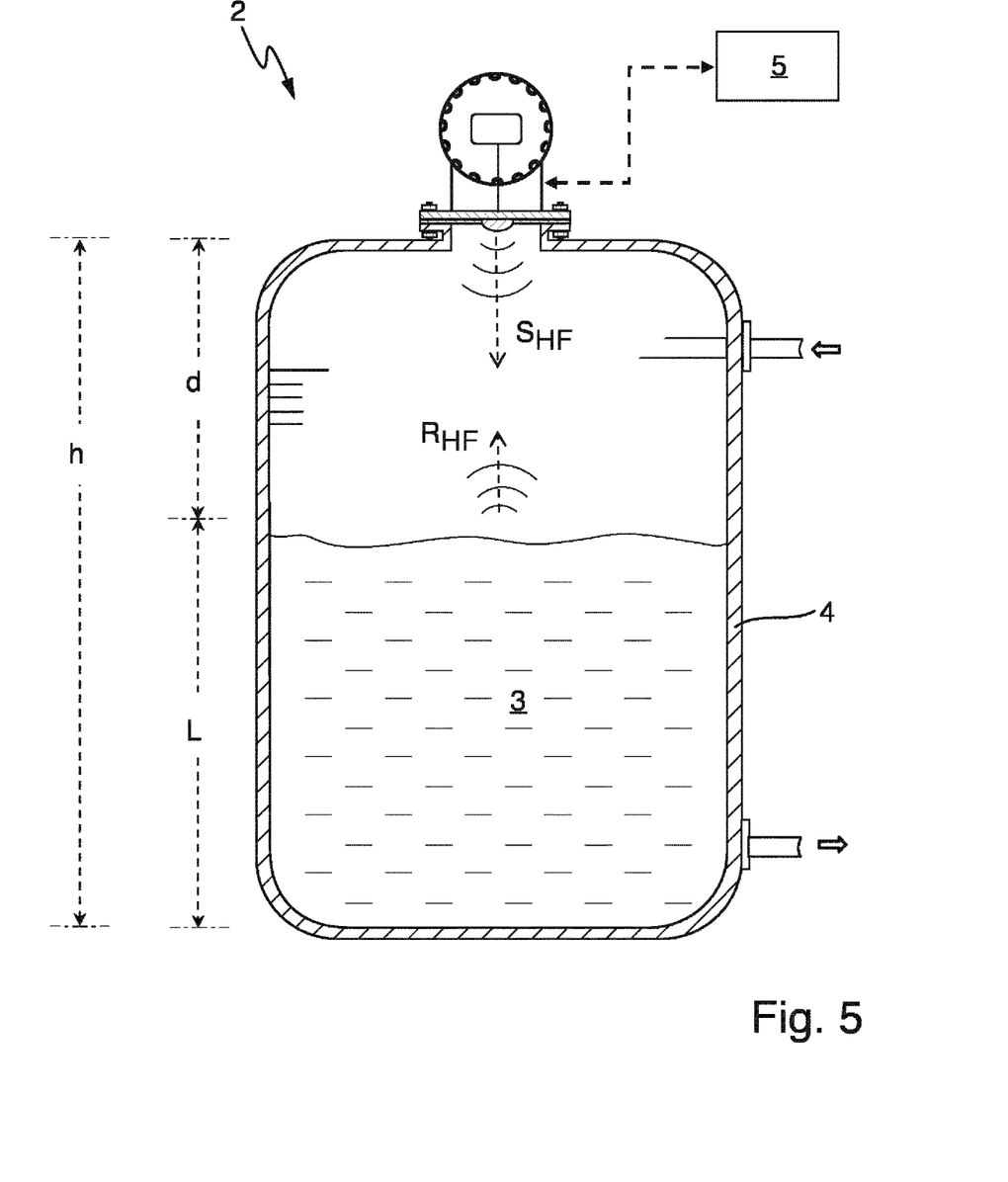
FIG. 5 shows a use of the high-frequency component in a fill-level measuring device.

FIG. 5 shows a possible use of the high-frequency component 1 according to the invention in a fill-level measuring device 2. Here, the fill-level measuring device 2 serves for measuring the fill level L of a filling material 3 located in a container 4. The filling material 3 can be, on the one hand, liquids, such as refinery products, for example oils or liquid gases, (waste) water, beverages or pharmaceutical components; however, it can also be solids, such as gravel, seed or the like.

For fill-level measurement, the fill-level measuring device 2 is attached to the container 4 above the filling material 3 and at a known installation height h. In this case, the fill-level measuring device 2 is aligned on the container 4 in such a way that radar signals $S_{HF}$ are emitted by means of the high-frequency component 1 in the direction of the surface of the filling material 3. For this purpose, the high-frequency component 1 couples into the antenna of the fill-level measuring device 2 the high-frequency signal $S_{HF}$ that is to be emitted as radar signal $S_{HF}$. After reflection at the filling-material surface, the reflected radar signal $R_{HF}$ is received by the antenna and correspondingly fed back as high-frequency signal $r_{HF}$ to the high-frequency component 1. Here, the fill-level measuring device 2 receives the reflected radar signal $R_{HF}$ as a function of the distance d=h−L relative to the filling-material surface. Since the installation height h is known (depending on the process plant, the installation height h can be up to more than 100 m), the fill level L can be determined based on the measured distance d by means of the above formula. In implementing the pulse transit time method, the distance d is calculated on the basis of the measured pulse transit time t of the emitted pulse-shaped radar signal $S_{HF}$. In the case of the FMCW method, the distance d is determined by means of the instantaneous difference frequency between the emitted, frequency-modulated radar signal $S_{HF}$ and the received, reflected radar signal $R_{HF}$.

As a rule, the fill-level measuring device 2 is connected by means of a bus system, such as "PROFIBUS," "HART," "Wireless HART" or "Ethernet" to a higher-level unit 5, such as a process control system or a database that can be controlled through the internet. On the one hand, this can be used to communicate information about the operating state of the fill-level measuring device 2. On the other hand, information about the fill level L can also be transmitted in order to control any inflows and/or outflows that may be present at the container 4.

Since the fill-level measuring device 2 is based on the high-frequency component 1 according to the invention, the fill-level measuring device 2 benefits from the low power consumption of the high-frequency component 1 and also from the radar frequencies of potentially over 100 GHz. The high radar frequency is above all expressed in a compact antenna or the correspondingly narrow beam cone of the radar signal $S_{HF}$ and also in a high resolution capability of the fill level L in the sub-millimeter range.

The invention claimed is:

1. A high-frequency component comprising:
a semiconductor component configured to generate and/or process electrical high-frequency signals;
a hollow waveguide; and
a coupling element in electrical contact with the semiconductor component as to couple the high-frequency signals into the waveguide and/or to couple radar signals from the waveguide as electrical signals into the semiconductor component,
wherein the high-frequency signals are coupled into the waveguide as radar signals, and
wherein the waveguide contacts the coupling element by a galvanic contact.

2. The high-frequency component of claim 1, wherein the coupling element has a thickness of at least 200 μm.

3. The high-frequency component of claim 1, wherein the semiconductor component and the coupling element are in contact via a soldered connection configured to enable transmission of the high-frequency signals.

4. The high-frequency component of claim 3, wherein the soldered connection between the semiconductor component and the coupling element is a ball grid array.

5. The high-frequency component of claim 1, wherein the semiconductor component is encapsulated with a potting compound.

6. The high-frequency component of claim 5, wherein the semiconductor component is encapsulated such that a contact surface adjacent the coupling element is free of potting compound and/or that the coupling element is free of potting compound at the galvanic contact surface adjacent the waveguide.

7. The high-frequency component of claim 5, wherein the coupling element is configured as an integral component of the potting compound.

8. The high-frequency component of claim 1, wherein the coupling element includes a substrate, and wherein the coupling element comprises:
a first metallization layer configured to form the galvanic contact to the waveguide;
a second metallization layer;
first electrical vias configured to contact the semiconductor component with the first metallization layer; and
second electrical vias between the first metallization layer and the second metallization layer.

9. The high-frequency component of claim 8, the substrate of the coupling element is a glass-based or ceramic-based substrate.

10. The high-frequency component of claim 8, wherein the first vias are arranged along an inner, quasi-closed path such that the radar signals propagating in the coupling element are guided predominantly in a defined fundamental mode, and
wherein the second vias are arranged along an outer, quasi-closed path such that the high-frequency signals are directed in a direction of an axis of the waveguide or are directed from the direction of the axis of the waveguide into a plane parallel to the first metallization layer and/or the second metallization layer.

11. The high-frequency component of claim 1, wherein the semiconductor component and the waveguide are disposed on a first surface of a printed circuit board substrate, and
wherein the coupling element is disposed on a surface of the semiconductor component opposite the printed circuit board substrate.

12. The high-frequency component of claim 1, wherein:
the coupling element is disposed on a first surface of a printed circuit board substrate;
the semiconductor component is disposed on a surface of a coupling element opposite the printed circuit board substrate;
the waveguide is connected to a second surface of the printed circuit board substrate opposite the coupling element; and
the waveguide is in contact with the coupling element by way of an opening in the printed circuit board.

13. The high-frequency component of claim 1, wherein the coupling element and the waveguide are disposed on a first surface of a printed circuit board substrate, and
wherein the semiconductor component is disposed on a surface of the coupling element opposite the printed circuit board substrate.

14. The high-frequency component of claim 1, wherein the semiconductor component is configured to generate the high-frequency signals at a frequency of at least 75 GHz.

15. A radar-based distance measuring device for determining a distance to a measurement object, the device comprising:
a high-frequency component according to claim 1; and
an antenna connected to the waveguide and configured to emit the radar signals in a direction of the measurement object and to receive reflected radar signals after reflection at the measurement object,
wherein the semiconductor component is configured to determine the distance based on at least the reflected radar signals.

16. A method for measuring a fill level of a filling material within a container, the method comprising:
providing the device according to claim 15;
measuring a distance between the device and the filling material within the container using the device according to claim 15; and
determining the fill level of the filling material within the container based on at least the measured distance.

17. A method for manufacturing the high-frequency component according to the claim 1, the method comprising:
electrically or mechanically contacting the coupling element to the semiconductor component; and
contacting the waveguide to the coupling element by a galvanic contact.

\* \* \* \* \*